US007016435B2

(12) United States Patent
Adachi

(10) Patent No.: US 7,016,435 B2
(45) Date of Patent: Mar. 21, 2006

(54) BROADCAST RECEIVER HAVING AUTOMATIC GAIN CONTROL FUNCTION

(75) Inventor: Kazuteru Adachi, Osaka (JP)

(73) Assignee: Funai Electric Co., Ltd., Daito (JP)

( * ) Notice: Subject to any disclaimer, the term of this patent is extended or adjusted under 35 U.S.C. 154(b) by 758 days.

(21) Appl. No.: 10/200,203

(22) Filed: Jul. 23, 2002

(65) Prior Publication Data
US 2003/0026364 A1 Feb. 6, 2003

(30) Foreign Application Priority Data
Jul. 23, 2001 (JP) .............................. 2001-222329

(51) Int. Cl.
H04L 27/08 (2006.01)
H04N 4/46 (2006.01)
(52) U.S. Cl. ...................... 375/345; 348/555
(58) Field of Classification Search ............... 375/260, 375/259, 316, 345, 151, 153, 147, 130; 348/678, 348/555, 548, 528, 525, 500, 731; 725/151
See application file for complete search history.

(56) References Cited

U.S. PATENT DOCUMENTS 6,219,108 B1 * 4/2001 LeRoy ........................ 348/724
6,307,599 B1 * 10/2001 Komatsu ..................... 348/731
6,725,463 B1 * 4/2004 Birleson ...................... 725/151
6,757,029 B1 * 6/2004 Kurihara ..................... 348/731
2002/0058487 A1 * 5/2002 Takeuchi ..................... 455/260

FOREIGN PATENT DOCUMENTS

| JP | 11-098426 | 4/1999 |
| JP | 11-261922 | 9/1999 |
| JP | 11-341392 | 12/1999 |

* cited by examiner

Primary Examiner—Tesfaldet Bocure
Assistant Examiner—Vineeta Panwalkar
(74) Attorney, Agent, or Firm—Crowell & Moring LLP

(57) ABSTRACT

A digital broadcast receiver has a function of selecting, at the time of receiving a digital broadcast, signals to be fed back to an AGC circuit depending on whether an analog broadcast channel exists adjacent to a channel to be received or not. When an analog broadcast channel exists adjacent to a channel to be received, a feedback system change-over switch is connected to a second feedback system and the voltage level of analog signals detected by an analog signal level detecting circuit is fed back. When an analog broadcast channel does not exist adjacent to the channel to be received, the feedback system change-over switch is connected to a first feedback system, and the voltage level of digital signals in a demodulating IC detected by a digital signal level detecting circuit is fed back. In such a manner, reception performance is improved.

3 Claims, 3 Drawing Sheets

BROADCAST RECEIVER HAVING AUTOMATIC GAIN CONTROL FUNCTION

BACKGROUND OF THE INVENTION

This invention relates generally to a digital broadcast receiver having a function of controlling the gain of the receiver by feeding back received broadcasting signals to an AGC (Automatic Gain Control) circuit.

In recent years, digital broadcasting signals in accordance with the ATSC (Advanced Television Systems Committee) standard has been transmitted from broadcasting stations. Therefore, broadcast receivers (set top box: abbreviated as STB hereinafter) are being spread which receive the digital broadcasting signals, converting the digital broadcasting signals into analog signals which can be received by existing television sets adapted to analog broadcasting in accordance with the NTSC (National Television Systems Committee) standard, and outputting the analog signals thereto. Since the present is in a period of transition from analog broadcasting to digital broadcasting, both analog broadcasting signals and digital broadcasting signals are transmitted. The STB has, therefore, a configuration including a tuner capable of receiving both the analog and digital broadcasting signals.

The intensity level of an electric wave received by the STB varies according to the intensities of electric waves generated by various broadcasting stations, weather conditions in a propagation path, and the like. Usually, broadcast receivers have therein an AGC circuit for suppressing fluctuations in contrast of an output image by automatically controlling (adjusting) the gain of a tuner in accordance with the intensity of a received electric wave to obtain a constant video detection output. As such an STB having therein an AGC circuit, there is a known broadcast receiver having a tuner for receiving both digital and analog signals, a digital AGC circuit for controlling the gain of the tuner when digital broadcasting signals are received, and an analog AGC circuit for controlling the gain of the tuner when analog broadcasting signals are received (refer to, for example, Japanese Patent Laid-open Application Nos. 11-98426, 11-261922, and 11-341392). In the broadcast receiver, signals outputted from the above-described two AGC circuits are switched by a separately provided voltage converting circuit (switching unit).

As a method of controlling the gain of a digital broadcasting signal, the following two methods have been already invented. According to the first method, broadcasting signals received by a tuner are sent to a filter such as an SAW (Surface Acoustic Wave) filter which allows broadcasting signals in a desired frequency band to pass therethrough. The broadcasting signals passed are A/D converted, demodulated in a predetermined manner, and then detected to be fed back to an AGC circuit. In such a process, the gain control is performed. In this case, the signals passed through the SAW filter are fed back to the AGC circuit, so that the gain control of the tuner is performed on the basis of the intensity level of signals on a channel to be received. According to the second method, the broadcasting signals received by the tuner are directly fed back to the AGC circuit, so that the gain control is performed on the basis of the broadcasting signals. In this case, the signals fed back to the AGC circuit have not passed through the SAW filter. Consequently, the gain control of the tuner is performed on the basis of the intensity levels of broadcasting signals in frequency bands of a channel to be received and of channels in the proximity to the channel,.

However, the intensity level of a digital broadcasting signal is lower than that of an analog broadcasting signal. In a conventional broadcast receiver, consequently, there is such a case that a proper gain control cannot be performed even when the above method is applied. For example, in the case where the digital broadcasting signals are transmitted on 3 CH, the analog broadcasting signals are transmitted on 2 CH and 4 CH adjacent to the 3 CH (state shown in FIG. 2A), and a user selects the 3 CH, if the first method is applied, the following problem occurs. That is, since the AGC circuit controls the gain of the tuner so that the signal intensity level of a channel to be received (e.g., 3 CH) becomes the optimum as described above, distortion may occur in signals on the 2 CH and the 4 CH having the signal intensity level higher than that on the 3 CH. The distortion which occurs in the signals on the 2 CH and the 4 CH exerts an influence on the signals on the 3 CH adjacent to the 2 CH and the 4 CH, and the signals cannot be properly received.

In the case where the digital broadcasting signals are transmitted on the 3 CH, the analog broadcasting signals are transmitted on 1 CH and 5 CH which are adjacent to the 3 CH with idle channels (2 CH and 4 CH) between (state shown in FIG. 2B), and the user selects the above-described 3 CH, if the second method is applied, the following problem occurs. That is, although unnecessary frequency components in the signals to be fed back to the AGC circuit are cut out by a filter provided at the output stage of the tuner, since the frequency characteristic of the filter in the tuner is gentle, the filter cannot separate broadcasting signals on the 1 CH and the 5 CH. Consequently, the broadcasting signals on the channels are fed back to the AGC circuit. As a result, the AGC circuit controls the gain of the tuner so that the range of the 1 CH or the 5 CH becomes the maximum range. Thus received broadcasting signals on the 3 CH has therefore a low intensity level since the gain control is not properly performed. Accordingly, the resolution of multi-value digital signals obtained by A/D converting the above-described broadcasting signals deteriorates, and an error rate at the time of demodulation of the multi-value digital signals to binary digital signals increases.

SUMMARY OF THE INVENTION

This invention is made to solve the above-mentioned problems and its object is to provide a digital broadcast receiver with improved reception performance that performs a proper gain control by selectively controlling signals to be fed back to an AGC circuit in accordance with the existence of an adjacent analog broadcast channel at the time of receiving digital broadcasting signals.

In order to achieve the above mentioned object, in accordance with an aspect of the present invention, a digital/analog broadcast receiver having an automatic gain control function comprises: an input unit for inputting a channel selection command to the receiver; a receiving unit for receiving broadcasting signals compressed in conformity with the MPEG (Moving Picture Experts Group) standard and transmitted from a broadcasting station in response to the channel selection command via the input unit; a SAW (Surface Acoustic Wave) filter for separating the broadcasting signals received by the receiving unit and passing only broadcasting signals in a desired frequency band; an A/D converter for converting the broadcasting signals passed through the SAW filter into multi-value digital signals; a demodulator for demodulating the multi-value digital signals to binary digital signals; an MPEG decoder for decoding the binary digital signals demodulated by the demodulator in conformity with the MPEG standard; a D/A converter for converting the signals decoded by the MPEG decoder into analog signals to be outputted to a display device connected to the receiver; an analog signal level detecting circuit for detecting an intensity level of the signals received by the receiving unit; a digital signal level detecting circuit for detecting an intensity level of the multi-value digital signals inputted to the demodulator; an AGC (Automatic Gain Control) circuit for receiving feedback of the broadcasting signals received by the receiving unit and of the multi-value digital signals to be demodulated by the demodulator so as to automatically control a gain of the receiving unit on the basis of the intensity levels of the signals; a memory for storing channel map information which is referred to at the time of a channel selection; and a control unit for controlling each component of the receiver, wherein, in response to a channel selection command received from the input unit, the control unit obtains a frequency of the channel selected by referring to the channel map and tunes the receiving unit to the frequency, wherein, when a broadcast channel to be received is a digital broadcast and analog broadcast channels exist adjacent to the channel to be received, the control unit outputs an instruction of making the AGC circuit control the gain of the receiving unit on the basis of the intensity level detected by the analog signal level detecting circuit, and when no analog broadcast channel exists adjacent to the channel to be received, the control unit outputs an instruction of making the AGC circuit control the gain of the receiving unit on the basis of the intensity level detected by the digital signal level detecting circuit.

In the configuration, the channel map information regarding the broadcast frequency of each channel and a digital/analog broadcasting system are prestored in the memory. On the basis of the channel map information, a channel is selected and information regarding each channel is provided to a user. The channel map information is created by, for example, scanning all of channels after the user installs the broadcast receiver. When the channel selection command received from the user is received, the control unit tunes the receiving unit to the broadcast frequency of the corresponding channel and further, by referring to the channel map information, obtains the broadcasting system (kind of the system which is either digital broadcasting or analog broadcasting) of the corresponding channel and the broadcasting systems of channels adjacent to the channel selected.

If the broadcast channel to be received is a digital broadcast, the control unit controls the AGC circuit in accordance with corresponding one of the following cases. Specifically, in the case where an analog broadcast channel exists adjacent to the channel to be received, the control unit feeds back the signal intensity level detected by the analog signal level detecting circuit to the AGC circuit to control the gain of the receiving unit. Since the signals detected by the analog signal level detecting circuit have not passed through the SAW filter, the signals also include broadcasting signals on analog broadcast channels adjacent to the selected channel. Since the electric wave intensity level of an analog broadcast is higher than that of a digital broadcast, the AGC circuit controls the gain so that the range of the analog broadcasts of the channels adjacent to the selected channel becomes the maximum range. Therefore, broadcasting signals on the channels adjacent to the selected channel are not distorted in the receiving unit and a proper gain can be obtained.

On the other hand, in the case where an analog broadcast channel does not exist adjacent to the selected channel, the signal intensity level detected by the digital signal level detecting circuit is fed back to the AGC circuit to control the gain of the receiving unit. In this case, the signals whose intensity level is detected by the digital signal level detecting circuit are digital signals in the desired frequency band passed through the SAW filter. Consequently, the signal intensity level fed back to the AGC circuit is that of the signals passed through the SAW filter, that is, the signals corresponding to the channel to be received, and the AGC circuit controls the gain of the receiving unit on the basis of the intensity level. At this time, there is a case that broadcasting signals on a channel other than the channel to be received are distorted in the receiving unit. However, since such signals are cut by the SAW filter later, there is no problem. As described above, according to this invention, when the broadcast channel to be received is a digital broadcast, according to whether an analog broadcast channel exists adjacent to the channel to be received or not, the optimum signals to be fed back to the AGC circuit are selected. The multi-value digital signal in this invention denotes a ternary or more digital signal. For example, in digital broadcasting conformed to the ATSC standard in North America, operations using a digital signal according to an octal VSB modulation system are performed to improve data transmission efficiency.

In accordance with another aspect of the present invention, a digital broadcast receiver having an automatic gain control function comprises: an input unit for inputting a channel selection command to the receiver; a receiving unit for receiving broadcasting signals transmitted from a broadcasting station in response to the channel selection command via the input unit; an A/D converter for converting the broadcasting signals received into digital signals; an AGC (Automatic Gain Control) circuit for receiving feedback of the broadcasting signals received and the digital signals obtained by the conversion by the A/D converter so as to automatically control a gain of the receiving unit on the basis of intensity levels of the signals; and a control unit for controlling each component of the receiver, wherein, in response to a channel selection command received from the input unit, the control unit obtains a frequency of the channel selected and tunes the receiving unit to the frequency, wherein, when a broadcast channel to be received is a digital broadcast and analog broadcast channels exist adjacent to the channel to be received, the control unit outputs an instruction of making the AGC circuit control the gain of the receiving unit on the basis of the intensity level of the broadcasting signals received by the receiving unit, and when no analog broadcast channel exists adjacent to the channel to be received, the control unit outputs an instruction of making the AGC circuit control the gain of the receiving unit on the basis of the intensity level of the digital signals obtained by the conversion by the A/D converter.

In the configuration, in the case where the broadcast channel to be received is a digital broadcast, the control unit controls the AGC circuit in accordance with the following cases. Specifically, when an analog broadcast channel exists adjacent to the channel to be received, the control unit feeds back the intensity level of the signals received by the receiving unit to the AGC circuit to control the gain of the receiving unit. The signals fed back to the AGC circuit include broadcasting signals on analog broadcast channels adjacent to the channel to be received. Since the electric wave intensity level of an analog broadcast is higher than that of a digital broadcast, the AGC circuit controls the gain so that the range of the analog broadcast on the channels adjacent to the channel to be received becomes the maximum range. Therefore, the analog broadcasting signals on the channels adjacent to the channel to be received are not distorted in the receiving unit and a proper gain can be obtained. On the other hand, if an analog broadcast channel does not exist adjacent to the channel to be received, the intensity level of signals converted by the A/D converter is fed back to the AGC circuit to control the gain of the receiving unit. In this case, for example, by providing a filter or the like between the receiving unit and the A/D converter, the gain of the receiving unit can be controlled on the basis of the intensity level of the digital signals obtained by converting the broadcasting signals in a desired frequency band. As described above, in this invention, when a broadcast channel to be received is a digital broadcast, according to whether or not an analog broadcast channel exists adjacent to the channel to be received, signals optimum to be fed back to the AGC circuit are selected.

The digital broadcast receiver having an automatic gain control function may further comprise a memory for storing channel map information referred to at the time of a channel selection, wherein the control unit obtains a frequency of the selected channel by referring to the channel map and further, determines whether the broadcast channel to be received and the adjacent channels are digital broadcasts or analog broadcasts. In the configuration, when the channel selection command is inputted by a user, by referring to the channel map information stored in the memory, optimum signals to be fed back to the AGC circuit can be immediately selected, and time required to select a channel and time required to control the gain can be shortened.

DETAILED DESCRIPTION OF THE PREFERRED EMBODIMENT OF THE PRESENT INVENTION

Figure 1:
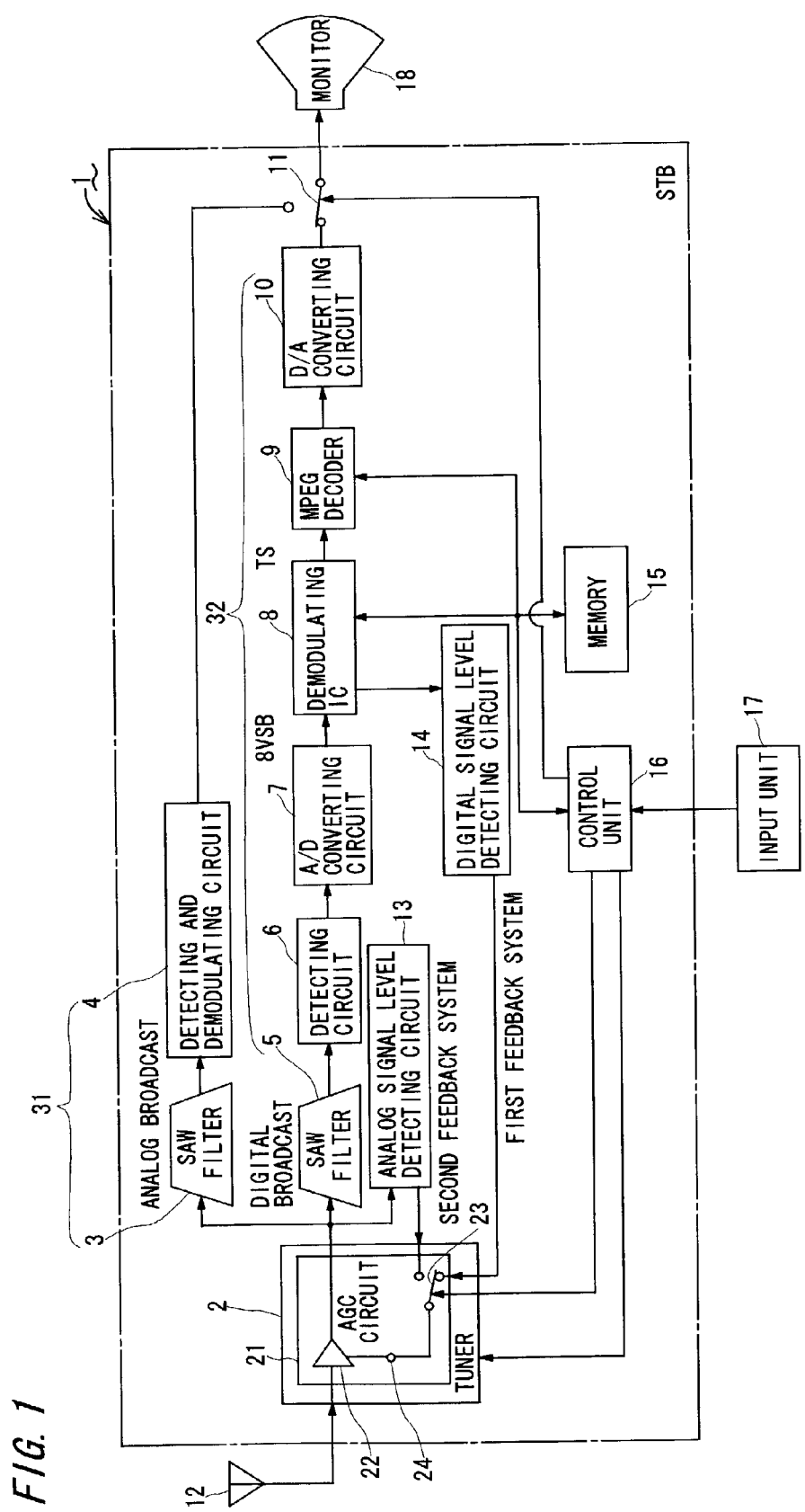
FIG. 1 is a block diagram of a broadcast receiver according to one embodiment of this invention.

Now, a digital broadcast receiver (set top box: abbreviated as STB hereinafter) according to one embodiment of this invention will be explained with reference to the drawings. FIG. 1 shows the configuration of blocks executing processes on video signals in the STB. An STB 1 receives digital broadcasting signals subjected to coding conformed to the ATSC standard, which is transmitted from a television broadcasting station via an antenna 12 by a tuner 2 (a receiving unit) in response to an operation input by a user using an input unit 17 such as a button provided for the body of the STB 1 or a remote controller. Then, the STB 1 converts the digital broadcasting signals to video signals conformed to the NTSC standard, and displays the video signals on a monitor 18 (a display device). The tuner 2 has therein an AGC circuit 21 for automatically controlling the gain at the time of receiving the broadcasting signals, thereby providing the STB 1 with an automatic gain control function.

The tuner 2 can receive both an analog broadcasting signal transmitted conventionally and the above-described digital broadcasting signal. To process both of the analog and digital broadcasting signals, the STB 1 has the configuration in which a signal processing system in a downstream of the tuner 2 is branched into an analog broadcast system 31 and a digital broadcast system 32. Each of the systems is controlled by a control unit 16 on the basis of channel map information and the like stored in a memory 15. The analog broadcast system 31 has an SAW filter for analog broadcasting signals 3 for separating the analog broadcasting signals received by the tuner 2 and passing only broadcasting signals in a desired frequency band, and a detecting and demodulating circuit 4 for detecting and demodulating the analog broadcasting signals passed through the SAW filter 3.

The digital broadcast system 32 includes: an SAW filter for digital broadcasting signals 5 (a SAW filter) for separating digital broadcasting signals received by the tuner 2 and passing only broadcasting signals in a desired frequency band; a detecting circuit 6 for detecting the digital broadcasting signals passed through the SAW filter 5; an A/D converting circuit 7 (an A/D converter) for converting the broadcasting signals detected by the detecting circuit 6 into octal digital signals conformed to an 8VSB (vestigial sideband) modulating system; a demodulating IC (integrated circuit) 8 (a demodulator) for demodulating the octal digital signals into binary digital signals; an MPEG decoder 9 for decoding the binary digital signals demodulated by the demodulating IC 8 on the basis of the MPEG standard; and a D/A converting circuit (a D/A converter) 10 for converting the signals decoded by the MPEG decoder 9 into analog signals to be outputted to the monitor 18 connected to the STB 1. A digital/analog change-over switch 11 is provided at the ends of the analog broadcast system 31 and the digital broadcast system 32. The digital/analog change-over switch 11 receives an instruction of the control unit 16 and selects one of the systems as the processing system of the signals to be outputted to the monitor 18.

To the demodulating IC 8, a digital signal level detecting circuit 14 is also connected. The digital signal level detecting circuit 14 detects the voltage level of the digital broadcasting signals demodulated by the demodulating IC 8 and feeds back the voltage level to the AGC circuit 21 (this system will be referred to as a first feedback system). An analog signal level detecting circuit 13 is connected to the tuner 2 and the SAW filters 3 and 5. The analog signal level detecting circuit 13 detects the voltage level of the broadcasting signals received by the tuner 2 and feeds back the voltage level to the AGC circuit 21 (this system will be referred to as a second feedback system).

On the other hand, the AGC circuit 21 includes a gain variable amplifier 22 for amplifying the gain, a gain control voltage input terminal 24 for applying a control voltage to the gain variable amplifier 22, and a feedback system change-over switch 23 for switching the first and second feedback systems. One end of the feedback system change-over switch 23 is connected to either the first or second feedback system in accordance with an instruction of the control unit 16, and the other end is connected to the gain control voltage input terminal 24. Therefore, by giving an instruction to the feedback system change-over switch 23, the control unit 16 can selectively control a voltage applied to the gain control voltage input terminal 24 of the gain variable amplifier 22. For example, when the one end of the feedback system change-over switch 23 is connected to the first feedback circuit (state shown in FIG. 1), an output voltage of the digital signal level detection circuit 14 is fed back. When the one end of the feedback system change-over switch 23 is connected to the second feedback circuit, an output voltage of the analog signal level detecting circuit 13 is fed back.

The memory 15 preliminarily stores broadcast frequencies of channels and channel map information regarding the digital and analog broadcasting systems. The channel map information is created by, for example, scanning all the channels after a user installs the STB 1. Also, when the user selects a digital broadcast channel, by analyzing control signals multiplexed on video signals or the like and transmitted, information regarding the channel can be obtained. Consequently, the channel map information may be updated as necessary. The control unit 16 can obtain the presence or absence of channels adjacent to a channel to be received and the broadcasting systems of the channels by referring to the channel map information.

Figure 2:
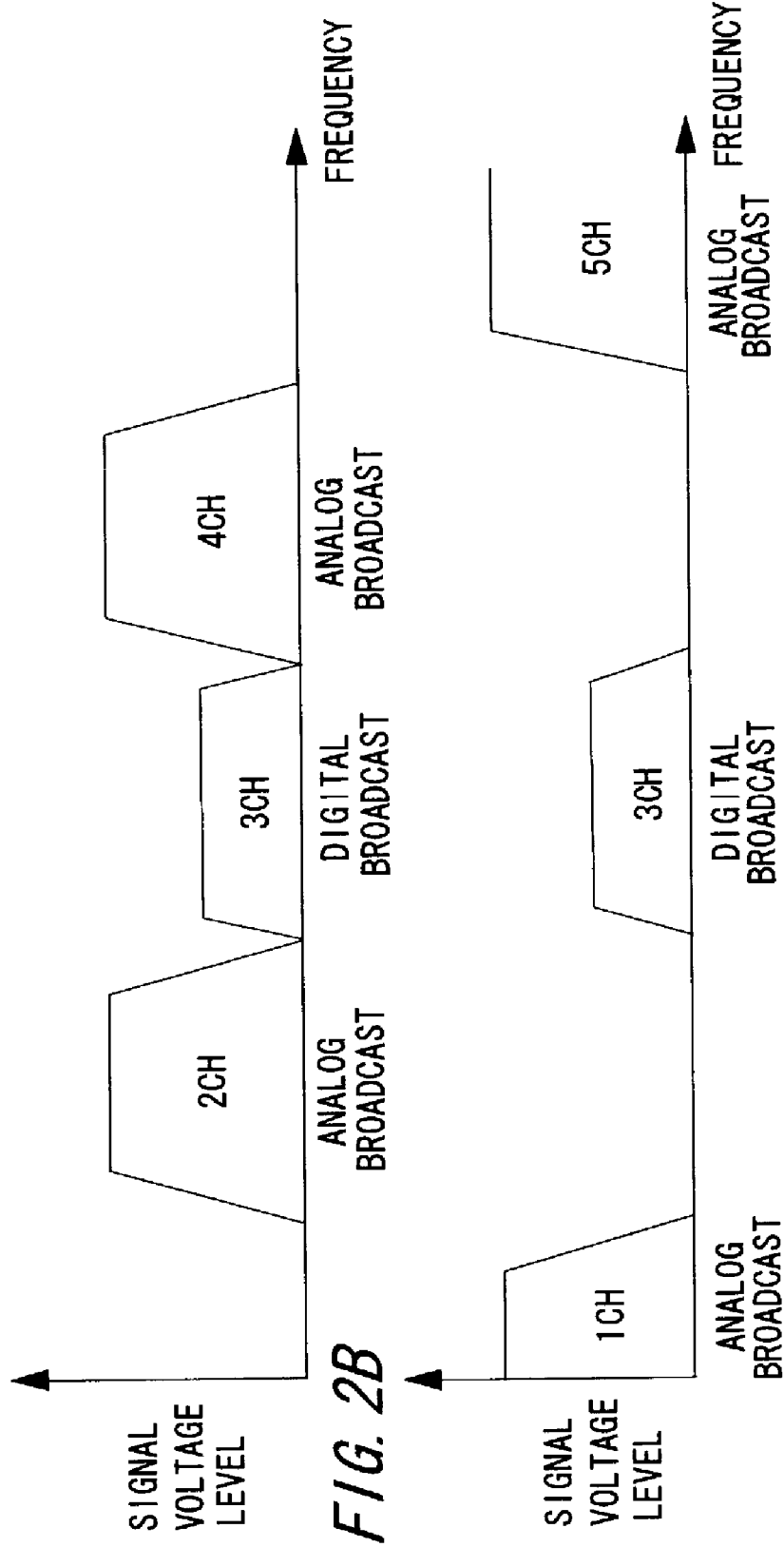
FIG. 2 is a diagram showing a voltage level of broadcasting signals on each channel received by the broadcast receiver.

FIG. 2A shows voltage levels of signals received by the tuner 2 in the case where digital broadcasting signals are transmitted on 3 CH, analog broadcasting signals are transmitted on 2 CH and 4 CH adjacent to the 3 CH, and a user selects the 3 CH. In this case, the control unit 16 outputs an instruction of connecting one end of the feedback system change-over switch 23 to the second feedback system side, and feeds back the voltage level of signals detected by the analog signal level detecting circuit 13 to the gain variable amplifier 22 to thereby control the gain of the tuner 2. Since the signals detected by the analog signal level detecting circuit 13 have not passed through the SAW filter 5, the signals also include broadcasting signals on the analog broadcast channels 2 CH and 4 CH adjacent to the 3 CH. Usually, as shown in FIG. 2, the electric wave intensity level of an analog broadcast is higher than that of a digital broadcast, so that the gain variable amplifier 22 receiving the signals fed back from the analog signal level detecting circuit 13 controls the gain of the tuner 2 in accordance with the voltage levels in the analog broadcast channels 2 CH and 4 CH. Therefore, signals on the 2 CH and the 4 CH are not distorted in the tuner 2 and the gain can be properly controlled. In the case where an analog broadcast exists in one of the channels neighboring to the channel to be received (either the 2 CH or the 4 CH), a similar control is performed.

FIG. 2B shows voltage levels of signals received by the tuner 2 in the case where the digital broadcasting signals are transmitted on the 3 CH, the analog broadcasting signals are transmitted on 1 CH and 5 CH which are adjacent to the 3 CH with idle channels between, and a user selects the 3 CH. In this case, the control unit 16 outputs an instruction of connecting one end of the feedback system changeover switch 23 to the first feedback system side, and feeds back the voltage level of signals detected by the digital signal level detecting circuit 14 to the gain variable amplifier 22 to control the gain of the tuner 2. At this time, the signals whose voltage level is detected by the digital signal level detecting circuit 14 are digital signals in a desired frequency band passed through the SAW filter 5. Consequently, the voltage level of the signals fed back to the gain variable amplifier 22 is that of the signals passed through the SAW filter 5, that is, the signals corresponding to the channel to be received, and the gain variable amplifier 22 controls the gain of the tuner 2 on the basis of the voltage level. At this time, there is a case that broadcasting signals on a channel other than the channel to be received are distorted in the tuner 2. However, since such signals are cut by the SAW filter 5 later, there is no problem.

Figure 3:
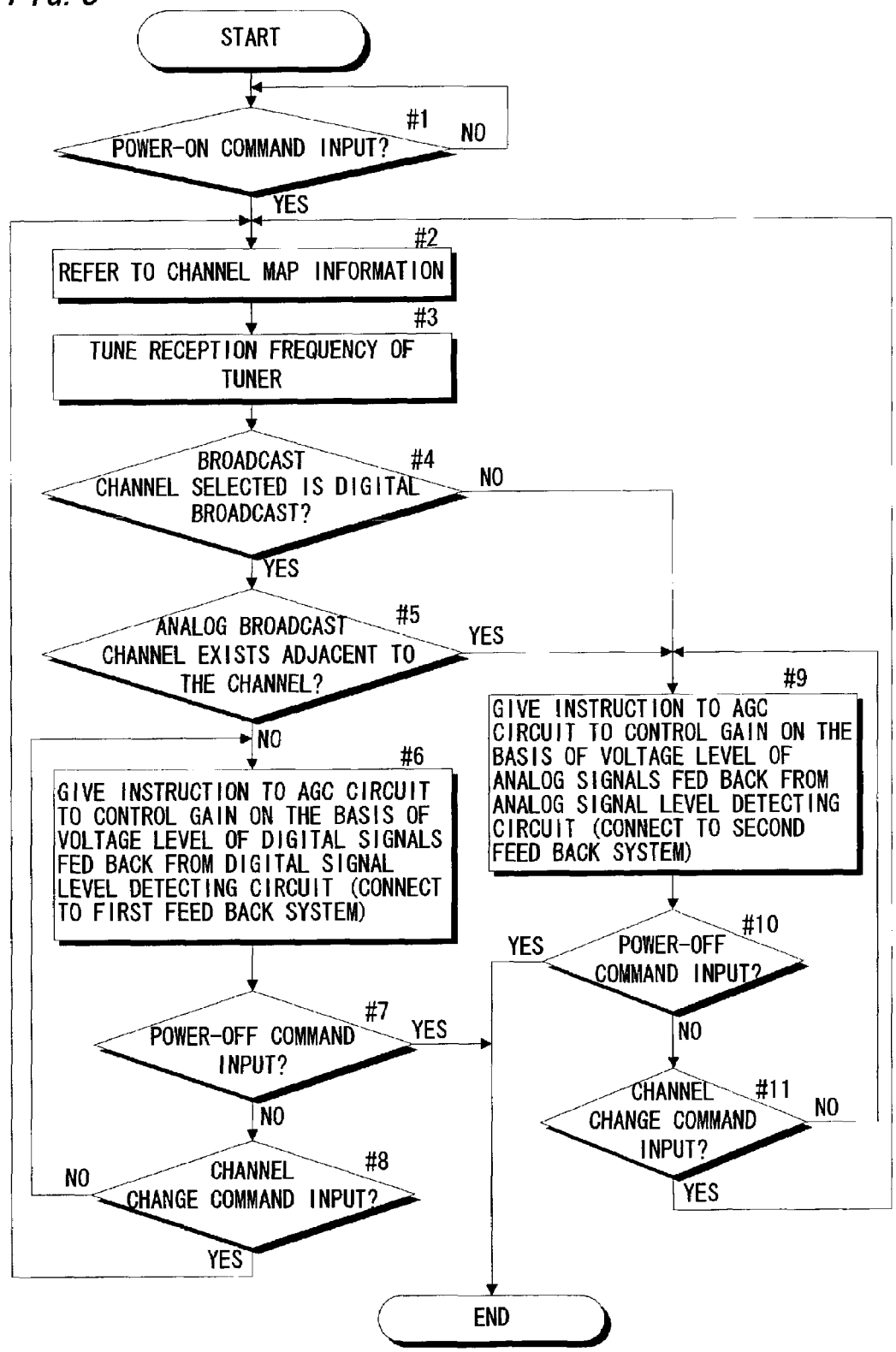
FIG. 3 is a flowchart showing a process executed by a control unit at the time of controlling the gain of a tuner built in the broadcast receiver.

FIG. 3 is a flowchart showing operation processes for the control unit 16 controlling the gain of the tuner 2 after the power source of the STB 1 is turned on. In response to a power-on command input from the input unit 17 (YES in step #1), the control unit 16 refers to the channel map information stored in the memory 15 (step #2) to obtain the broadcast frequency of the channel to be received, and tunes the reception frequency of the tuner 2 (step #3). If the broadcast channel selected is a digital broadcast (YES in step #4), the channel map information is referred to again to check the broadcasting systems of both channels adjacent to the channel to be received (step #5). If no analog broadcast channel exists adjacent to the channel (NO in step #5), an instruction is given to the feedback system change-over switch 23 of the AGC circuit 21 so as to connect to the first feedback system, so that the gain is controlled on the basis of the voltage level of the digital signals fed back from the digital signal level detecting circuit 14 (step #6). If a power-off command is not inputted from the input unit 17 (NO in step #7), the control unit 16 waits for a channel change command input. If there is no input of the channel change command (NO in step #8), the control unit 16 returns to the step #6 and controls the gain. If the channel change command is inputted (YES in step #8), the control unit 16 returns to step #2.

On the other hand, when an analog broadcast exists on at least one of the adjacent channels (YES in step #5), an instruction of connection to the second feedback system is outputted to the feedback system change-over switch 23 of the AGC circuit 21, so that the gain is controlled on the basis of the voltage level of the analog signals fed back from the analog signal level detecting circuit 13 (step #9). If a power-off command is not inputted (NO in step #10), the control unit 16 waits for input of a channel change command. If a channel change command is not inputted (NO in step #11), the control unit 16 returns to step #9 and controls the gain. When the channel change command is inputted (YES in step #11), the control unit 16 returns to step #2. If the broadcast channel selected is not a digital broadcast (NO in step #4), the control unit 16 moves to step #9 where the voltage level of the analog signals is fed back from the analog signal level detecting circuit 13. When the power-off command is inputted in step #7 or #10 (YES in steps #7, #10), the process is finished. As described above, in the STB 1, when the broadcast channel to be received is a digital broadcast, depending on whether analog broadcast channels exist adjacent to the channel to be received or not, an optimum signal to be fed back to the gain variable amplifier 22 is properly selected. In such a manner, the STB 1 has the system resistant to interference from adjacent channels in the case where a broadcast station (channel) having a different reception electric wave level exists in the vicinity of the channel to be received, thereby realizing improved reception performance.

This invention is not limited to the configuration of the above-described embodiment but can be variously modified. For example, the determination in steps #4 and #5 can be made without referring to the channel map stored in the memory 15. In this case, it is sufficient to obtain information on the channel to be received and on both adjacent channels by analyzing, at the time of a channel change, control signals multiplexed on video signals or the like and transmitted. While the AGC circuit in the above-described embodiment controls the gain on the basis of the voltage level of digital/analog signals, the gain may be also controlled on the basis of the current level thereof. Further, the digital broadcast receiver is not limited to the form of the STB 1 but may be built in a monitor such as a television set.

What is claimed is:

1. A digital/analog broadcast receiver having an automatic gain control function, comprising: an input unit for inputting a channel selection command to the receiver; a receiving unit for receiving broadcasting signals compressed in conformity with the MPEG (Moving Picture Experts Group) standard and transmitted from a broadcasting station in response to the channel selection command via the input unit; a SAW (Surface Acoustic Wave) filter for separating the broadcasting signals received by the receiving unit and passing only broadcasting signals in a desired frequency band; an A/D converter for converting the broadcasting signals passed through the SAW filter into multi-value digital signals; a demodulator for demodulating the multi-value digital signals to binary digital signals; an MPEG decoder for decoding the binary digital signals demodulated by the demodulator in conformity with the MPEG standard; a D/A converter for converting the signals decoded by the MPEG decoder into analog signals to be outputted to a display device connected to the receiver; an analog signal level detecting circuit for detecting an intensity level of the signals received by the receiving unit; a digital signal level detecting circuit for detecting an intensity level of the multi-value digital signals inputted to the demodulator; an AGC (Automatic Gain Control) circuit for receiving feedback of the broadcasting signals received by the receiving unit and of the multi-value digital signals to be demodulated by the demodulator so as to automatically control a gain of the receiving unit on the basis of the intensity levels of the signals; a memory for storing channel map information which is referred to at the time of a channel selection; and a control unit for controlling each component of the receiver, wherein, in response to a channel selection command received from the input unit, the control unit obtains a frequency of the channel selected by referring to the channel map and tunes the receiving unit to the frequency, wherein, when a broadcast channel to be received is a digital broadcast and analog broadcast channels exist adjacent to the channel to be received, the control unit outputs an instruction of making the AGC circuit control the gain of the receiving unit on the basis of the intensity level detected by the analog signal level detecting circuit, and when no analog broadcast channel exists adjacent to the channel to be received, the control unit outputs an instruction of making the AGC circuit control the gain of the receiving unit on the basis of the intensity level detected by the digital signal level detecting circuit.

2. A digital broadcast receiver having an automatic gain control function, comprising: an input unit for inputting a channel selection command to the receiver; a receiving unit for receiving broadcasting signals transmitted from a broadcasting station in response to the channel selection command via the input unit; an A/D converter for converting the broadcasting signals received into digital signals; an AGC (Automatic Gain Control) circuit for receiving feedback of the broadcasting signals received and the digital signals obtained by the conversion by the A/D converter so as to automatically control a gain of the receiving unit on the basis of intensity levels of the signals; and a control unit for controlling each component of the receiver, wherein, in response to a channel selection command received from the input unit, the control unit obtains a frequency of the channel selected and tunes the receiving unit to the frequency, wherein, when a broadcast channel to be received is a digital broadcast and analog broadcast channels exist adjacent to the channel to be received, the control unit outputs an instruction of making the AGC circuit control the gain of the receiving unit on the basis of the intensity level of the broadcasting signals received by the receiving unit, and when no analog broadcast channel exists adjacent to the channel to be received, the control unit outputs an instruction of making the AGC circuit control the gain of the receiving unit on the basis of the intensity level of the digital signals obtained by the conversion by the A/D converter.

3. The digital broadcast receiver having an automatic gain control function according to claim 2, further comprising a memory for storing channel map information referred to at the time of a channel selection, wherein the control unit obtains a frequency of the selected channel by referring to the channel map and further, determines whether the broadcast channel to be received and the adjacent channels are digital broadcasts or analog broadcasts.

* * * * *